(12) United States Patent
Seddon et al.

(10) Patent No.: US 9,231,560 B2
(45) Date of Patent: Jan. 5, 2016

(54) PHASED-ARRAY RF PULSE GENERATOR

(71) Applicant: MBDA UK Limited, Bristol (GB)

(72) Inventors: Nigel Seddon, Bristol (GB); Philip Leslie Mason, Bristol (GB); Mark Owen, Bristol (GB)

(73) Assignee: MBDA UK LIMITED, Bristol (GB)

( * ) Notice: Subject to any disclaimer, the term of this patent is extended or adjusted under 35 U.S.C. 154(b) by 178 days.

(21) Appl. No.: 13/989,682

(22) PCT Filed: May 14, 2013

(86) PCT No.: PCT/GB2013/051242
§ 371 (c)(1),
(2) Date: May 24, 2013

(87) PCT Pub. No.: WO2013/171479
PCT Pub. Date: Nov. 21, 2013

(65) Prior Publication Data
US 2015/0035614 A1   Feb. 5, 2015

(30) Foreign Application Priority Data

May 15, 2012 (GB) .................................. 1208577.5

(51) Int. Cl.
H04B 3/04 (2006.01)
H03H 11/18 (2006.01)
H03K 3/45 (2006.01)
H03K 3/80 (2006.01)
H03K 5/01 (2006.01)

(52) U.S. Cl.
CPC .................. *H03H 11/18* (2013.01); *H03K 3/45* (2013.01); *H03K 3/80* (2013.01); *H03K 5/01* (2013.01)

(58) Field of Classification Search
CPC ........... H03H 11/18; H03K 3/45; H03K 3/80; H03K 5/01

USPC .......................................................... 333/20
See application file for complete search history.

(56) References Cited

U.S. PATENT DOCUMENTS

| 5,923,227 | A | 7/1999 | Seddon |
| 7,170,444 | B1 | 1/2007 | Seddon et al. |
| 7,342,534 | B1 | 3/2008 | Seddon et al. |
| 7,450,059 | B1 | 11/2008 | Seddon |
| 2009/0206903 | A1 | 8/2009 | Seddon et al. |

FOREIGN PATENT DOCUMENTS

| GB | 2 317 752 A | 4/1998 |
| GB | 2 368 213 A | 4/2002 |
| GB | 2433167 A | 6/2007 |
| WO | WO 2007/141576 A1 | 12/2007 |

OTHER PUBLICATIONS

Notification of Transmittal of the International Search Report (Forms PCT/ISA 220 and PCT/ISA 210) and the Written Opinion of the International Searching Authority (Form PCT/ISA 237) or the Declaration dated Aug. 30, 2013, issued in corresponding International Application No. PCT/GB2013/051242. (11 pgs).

*Primary Examiner* — Stephen E Jones
*Assistant Examiner* — Scott S Outten
(74) *Attorney, Agent, or Firm* — Buchanan Ingersoll & Rooney PC

(57) ABSTRACT

A phased-array RF pulse generator is disclosed which includes a video-pulse generator arranged to generate video pulses each having a leading edge. An array of nonlinear and dispersive transmission lines, are arranged to generate RF pulses from the video pulses. At least one sensor is arranged to detect the leading edge of the video pulses after they have passed along the transmission lines. A phase controller is arranged to set the velocity of the video pulses in each transmission line to put the detected leading edges, and hence the generated RF pulses, into a desired phase relationship.

16 Claims, 2 Drawing Sheets

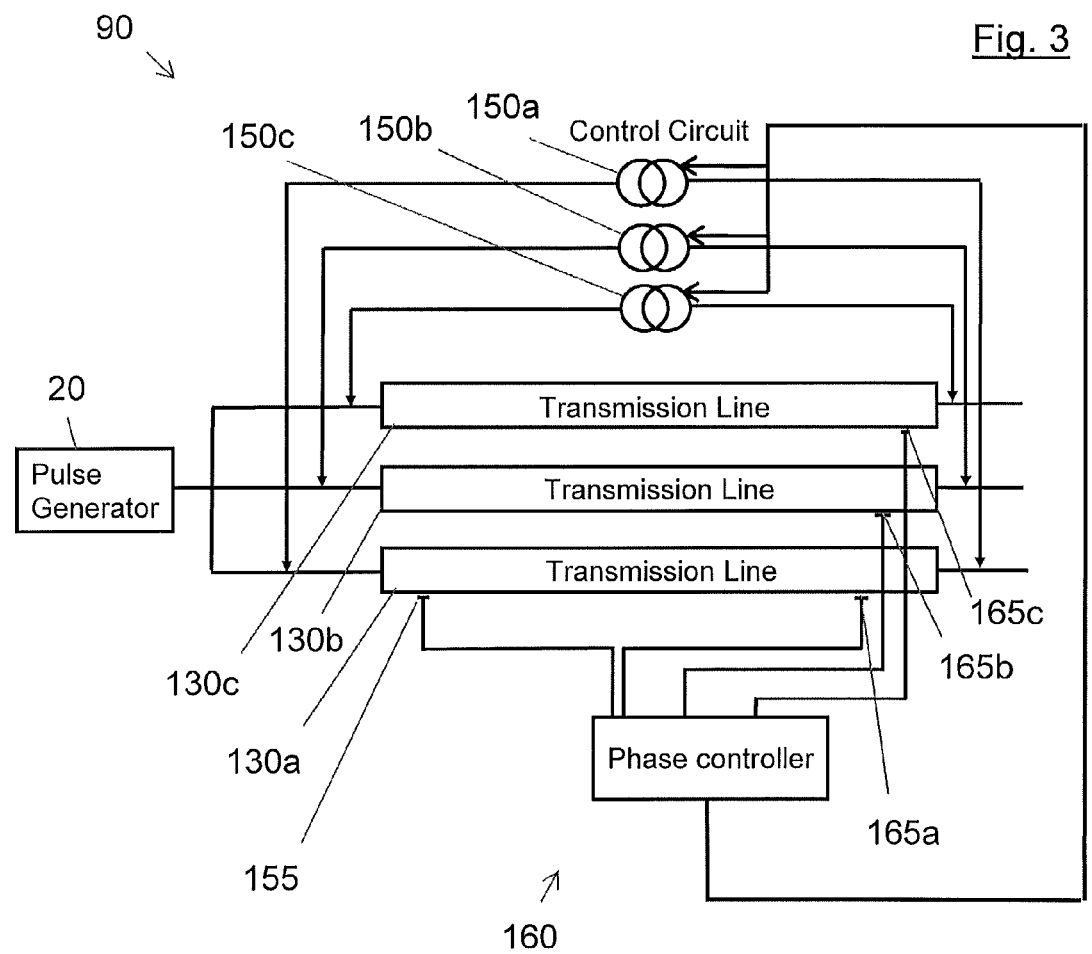

PHASED-ARRAY RF PULSE GENERATOR

FIELD OF THE INVENTION

This invention relates to the field of phased-array radio-frequency (RF) pulse generators. The invention relates especially to control of pulsed RF generators, and more particularly to phase and/or frequency control of arrays of pulsed RF generators that have dispersive characteristics. The invention relates more especially to RF pulse generator arrays based on nonlinear and dispersive RF-generating transmission lines.

BACKGROUND ART

In the prior art, circuits are described that use nonlinear and dispersive transmission lines to produce pulsed RF signals. (As used herein, the terms radio frequency (or RF) refers to microwave or longer electromagnetic waves.) An electrical pulse is injected into such a transmission line, and the non-linear and dispersive characteristics of the line act to form a high-frequency signal as the pulse propagates along the transmission line. Several different types of nonlinear material and several types of dispersive characteristics are available to be employed to produce RF circuits with output frequencies in the 0.1 GHz to 100 GHz frequency range.

Specifically, it is known to use nonlinear, dispersive transmission lines to convert video pulses (electrical pulses having a broad top-hat shape, with a short rise time compared with their pulsewidth, i.e. a constant amplitude for almost all of their duration) into RF pulses. A typical form of nonlinear, dispersive transmission line for this application is a variant of a standard inductance/capacitance (LC) ladder transmission line, to which nonlinearity and dispersive characteristics have been added. For example, it is known to add non-linearity to such a transmission line by providing saturable magnetic material in the inductive elements of the ladder, and to provide increased dispersion by coupling an extra capacitor across pairs of LC unit components of the ladder. Typically, the nonlinear dispersive transmission lines are created by placing thin sheets of conductors and insulators on top of each other to provide the required transmission-line components. GB 2317752A (British Aerospace) describes an alternative structure, in which the capacitative elements are formed from conductive blocks. This arrangement reduces the effects of stray capacitances and stray inductances, and thereby increases the upper limit of the generated frequency and operating RF voltage of the transmission line.

In the prior art, techniques to change the frequency and timing of the RF output pulse are described, usually by application of an adjustable DC current, voltage signal or applied magnetic field to the transmission line. GB 2 368 213A (BAE Systems plc) describes a pulse generator using a nonlinear, dispersive transmission line in which the frequency of the generated signal can be tuned over a much wider range at high powers than was the case with previous pulse generators. A nonlinear and dispersive LC ladder transmission line, of the type described above, is tuned by applying a low-power electrical signal to the nonlinear inductance components, thereby modifying the extent of the nonlinearity of the inductance component, and hence the output frequency of the generated signal. Specifically, a low-power direct current is applied to the transmission line, which flows in the inductors and couples with the saturable magnetic material in each inductor. The initial dc current is used to set the saturable magnetic material at a certain point on its hysteresis loop; the dc current can then be adjusted to tune the generated signals.

It is also known to use nonlinear capacitors in the LC circuit elements of the transmission lines. The LC circuit elements can then be tuned by varying the initial charge voltage of the nonlinear capacitors.

An ability to control the frequency and the timing of the RF output pulse from nonlinear dispersive transmission line circuits allows arrays of these circuits to be operated in phase synchronism. In this way large, RF-transmitting arrays can be produced that provide control over the output frequency and relative phase of each element in the array. U.S. Pat. No. 7,342,534 (Seddon et al.) describes a phased-array RF pulse generator in which an array of such tunable, nonlinear, dispersive transmission lines are provided. Each transmission line of the array is individually tunable to provide its generated signal with a desired phase relative to the phases of the other transmission lines of the array, enabling effects such as beam shaping and beam steering to be achieved in the overall generated signal.

Whilst each of those prior-art documents describes nonlinear, dispersive transmission lines based on LC ladder transmission lines, nonlinear, dispersive transmission lines can be achieved in other ways. For example, WO 2007/141576A1 (BAE Systems plc) describes a nonlinear, dispersive transmission line that transfers video-pulse energy to RF frequencies using a transmission line modulator based on an impulse-excited gyromagnetic action.

In order to ensure the correct output frequency and timing relationships between several individual RF sources in an array, the frequency and relative phase of the generated RF is monitored and any required adjustments are made to the system to bring it to the correct relationships. The output signal from this type of transmission line circuit is usually a short duration RF pulse with duration of a few RF cycles up to about 100 RF cycles. The short duration of the RF signal makes it difficult to determine the phase and frequency of each RF source. Known prior-art techniques include measuring the frequency of the generated RF signals by passing the RF signal through a dispersive structure, such as a RF delay line, and measuring the pulse propagation time through the RF delay line. Knowledge of the dispersion characteristics of the RF delay line (in particular the propagation velocity as a function of frequency) allows the frequency of the signal to be calculated from measurement of the propagation delay. It is conventional practice to analyse the frequency and phase of short-duration pulsed RF signals using fast transient recording devices that are based on analog to digital convertors (ADCs). The analog RF signal is sampled and digitised, and the digitised signal can then be processed to give a wide range of signal characteristics such as frequency content and relative phase information. Individual ADC devices are currently limited to sampling rates of about 4 GS/s. In order to faithfully represent signals with frequencies of 1 GHz or higher, it is necessary to use interleaving techniques, repetitive pulse sampling and sophisticated digital data processing. Those techniques require relatively expensive systems that are suitable for monitoring only relatively small numbers of RF sources. However, large transmitter arrays require a significant number of measurement channels (much more than 10 elements), for which an ADC-based control system is both bulky and costly (typically several tens of thousands of pounds).

It would be advantageous to provide a phased-array RF pulse generator in which one or more of the aforementioned disadvantages is eliminated or at least reduced.

DISCLOSURE OF THE INVENTION

The present invention allows phase synchronisation, and optionally frequency control, of large arrays of RF pulse generators.

A first aspect of the invention provides a phased-array RF pulse generator, comprising:

at least one video-pulse generator arranged to generate video pulses each having a leading edge;

an array of nonlinear and dispersive transmission lines, arranged to generate RF pulses from the video pulses;

at least one sensor arranged to detect the leading edge of the video pulses after they have passed along the transmission lines; and a phase controller arranged to set the velocity of the video pulses in each transmission line to put the detected leading edges, and hence the generated RF pulses, into a desired phase relationship.

Thus, the timings of video pulses travelling along each transmission line are monitored and adjusted to provide the pulses with a desired phase relative to the phases of the video pulses in the other transmission lines of the array. The nonlinear and dispersive transmission line acts as a video-to-RF generator, and the generated RF pulses also have the desired phase relationship. The video pulse acts as a pump signal and propagates along the transmission line: the RF signal originates from the leading edge of the propagating pump pulse such that the leading edge of the generated RF signal is coincident with the leading edge of the pump pulse. The method allows the required phase relationships to be imposed across a large array of RF sources by measurement of differences in the timings of the video pulses propagating in each of the transmission lines.

It may be that the at least one sensor detects the leading edge of the video pulses after they have passed completely along the whole length of the transmission lines. Alternatively, it may be that the at least one sensor detects the leading edge of the video pulses after they have passed along a substantial length, for example over half the whole length, of the transmission lines.

It may be that each transmission line has at least one sensor.

Optionally, the RF pulse generator further comprises a further sensor arranged to detect the leading edge of the video pulses at an earlier point in their propagation than the sensor used in the setting of the phase of the pulses.

The RF pulse generator may include a frequency controller configured to calculate time of flight of the video pulses from the detections of the leading edges by the sensor and the further sensor and to adjust the velocities of the video pulses so that RF pulses of a desired RF frequency are generated in the transmission lines. The velocity of each video pulse (and corresponding generated RF signal) is uniquely related to the frequency of the generated RF signal by the dispersion characteristics of the transmission line. Consequently, measurement of the pulse propagation delay in the transmission line can be used to uniquely determine the frequency of the generated RF signal from known dispersion characteristics of the transmission line. Thus, the frequency controller may be configured to adjust the velocities of the video pulses in accordance with transmission-line dispersion characteristics, which may for example be stored in a look-up table.

The transmission line may include a plurality of inductive and capacitative elements, which may form a LC ladder. It may be that the inductive elements include a saturable magnetic material, which may cause the nonlinearity of the transmission line. It may be that the capacitative elements comprise at least one nonlinear capacitor (i.e. a capacitor having a voltage-dependent capacitance), which may cause the nonlinearity of the transmission line. The transmission line may include a plurality of capacitors connected to the LC ladder to cause dispersion.

Alternatively, the transmission line may be configured to provide nonlinearity and dispersion as a result of an impulse-excited gyromagnetic action.

It may be that each transmission line is associated with a velocity controller arranged to control the velocity of the video pulses as they pass along the transmission line. The controlled velocity may be a velocity set by the phase controller. It may be that the velocity controller controls the velocity of the video pulses by controlling a DC current, a voltage signal or an applied magnetic field applied to the transmission line, for example to the inductive material in an LC ladder.

The at least one sensor and/or the further sensor may be connected to a time-to-digital converter (TDC), which may be comprised in the phase controller. TDCs are relatively inexpensive compared to analogue-to-digital converters (ADCs), and TDCs are available that can monitor large numbers of timing events (e.g. more than 10).

It may be that the generated RF pulses are microwave pulses, i.e. pulses in the frequency range 100 MHz to 300 GHz, for example in the range 100 MHz to 100 GHz, for example in the range 300 MHz to 100 GHz.

It may be that the generated RF pulses have a duration of more than 3 RF cycles, for example more than 5 RF cycles, or more than 10 RF cycles. It may be that the generated RF pulses have a duration of less than 150 RF cycles, for example less than 120 RF cycles, or less than 100 RF cycles.

A second aspect of the invention provides a method of generating RF pulses, comprising:

generating video pulses each having a leading edge;

using an array of nonlinear and dispersive transmission lines to generate RF pulses from the video pulses;

detecting the leading edge of the video pulses after they have passed along the transmission lines; and controlling the velocity of the video pulses in each transmission line to put the detected leading edges, and hence the generated RF pulses, into a desired phase relationship.

Another aspect of the invention provides a phased-array radar including a phased-array RF pulse generator according to the first aspect of the invention.

Another aspect of the invention provides a directed-energy weapon including a phased-array RF pulse generator according to the first aspect of the invention.

It will of course be appreciated that features described in relation to one aspect of the present invention may be incorporated into other aspects of the present invention. For example, the method of the invention may incorporate any of the features described with reference to the RF pulse generator of the invention and vice versa.

BRIEF DESCRIPTION OF THE DRAWINGS

Example embodiments of the invention will now be described by way of example only and with reference to the accompanying drawings, of which:

FIG. 3 is a schematic diagram of a tuneable RF pulse generator according to an example embodiment of the invention.

For convenience and economy, the same reference numerals are used in different figures to label identical or similar elements of the RF pulse generators shown.

DETAILED DESCRIPTION

In an example embodiment of the invention, the output frequencies and output phases of an array of microwave pulse generators are controlled.

Figure 1:
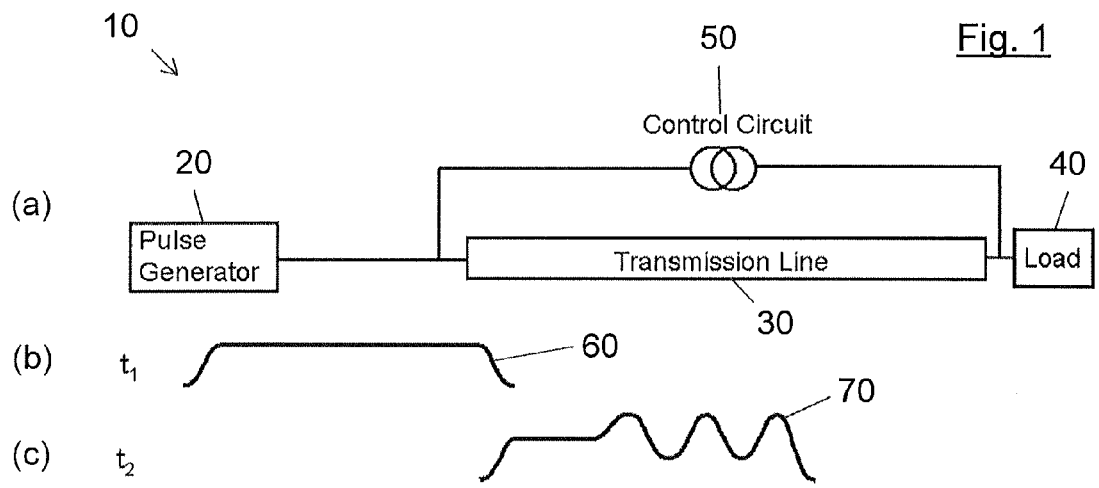
FIG. 1 is (a) a schematic diagram of a prior-art tuneable RF pulse generator, (b) a pump video pulse, and (c) the pulse of (b) after propagation within a transmission line of the generator of (a)
Figure 2:
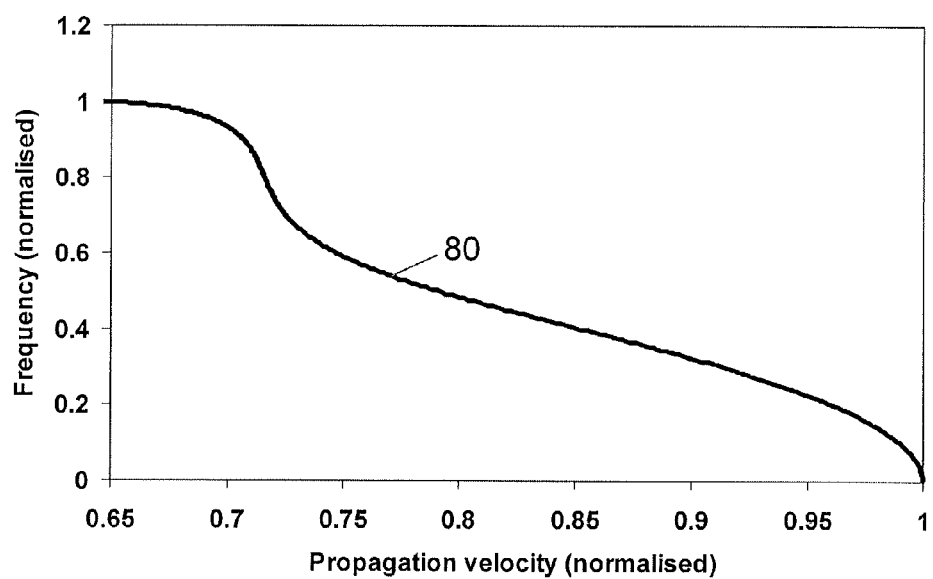
FIG. 2 is a plot of the relationship between propagation velocity and frequency (both normalised units) in the transmission line of FIG. 1)

A prior-art microwave pulse generator 10 (FIG. 1(*a*)), of the type described above, and in GB 2368213A (BAE Systems plc), comprises a video pulse generator 20 connected to a nonlinear, dispersive transmission line 30, which is in turn connected to a load 40. The nonlinearity of the transmission line, and hence the frequency of microwave pulses generated therein, is controlled by a control circuit 50. The video pulse generator 20 generates an electrical video pulse, i.e. a pulse 60 having the form shown schematically in FIG. 1(*b*). The nonlinearity and dispersion of the transmission line 30 result in the pulse shape shifting to that of a video pulse 70 carrying a microwave-frequency modulation. The dispersion curve 80 (FIG. 2) of the transmission line 30 (i.e. the variation of oscillation frequency with phase velocity) is a monotonically decreasing curve.

In a microwave pulse generator 90 according to an example embodiment of the invention (FIG. 3), the video pulses 60 are generated by the pulse generator 20 and pass into a plurality of transmission lines (three transmission lines 130*a-c* are shown in FIG. 3). Each transmission line is associated with a control circuit 150*a-c*, which is configured to adjust the phases of the microwave-modulated pulses 70 generated from each transmission line 130*a-c*, relative to each other. The microwave pulse generator 90 further comprises a phase controller 160, which includes a time-to-digital converter (TDC). The TDC calculates the time difference(s) between two (or more) signal edges. An input sensor 155 is positioned at the start of one of the transmission lines 130*a* and is arranged to detect the leading edge of the input video pulse 60 in the transmission line 130*a*. The phase controller is also connected to an output sensor 165*a-c* at the end of each of the transmission lines 130*a-c*. The output sensors 165*a-c* are arranged to detect the leading edge of each microwave modulated pulse 70 as it leaves its respective transmission line 130*a-c*.

As can be seen in FIG. 1(*c*), the microwave modulation originates from the leading edge of the propagating pump pulse 70. The leading edge of the generated microwave signal is thus coincident with the leading edge of the pump pulse. Thus, by detecting the leading edge of the input video pulse 60 and the microwave modulated pulses 70 in each transmission line 130*a-c*, the phase controller 160 is effectively detecting the leading edge of the generated microwave signal.

As discussed above, by varying the nonlinear characteristics of a transmission line it is possible to vary the pulse propagation velocity in each line. This allows the frequency and the relative timing (phase) of the RF signal in each line to be measured and controlled. In use, the propagation delay of the pump pulse (and therefore the microwave signal) along transmission line 130*a* is measured and the phase controller 160 compares the measured delay with delays recorded in a look-up table that records the dispersion characteristic of the transmission line; the phase controller 160 thereby determines the frequency of the generated microwave signal that corresponds to the measured pump pulse propagation delay. If the propagation delay does not correspond to the required frequency, an adjustment is made to all of the control circuits 150*a-c* which adjusts the nonlinearity of the transmission lines 130*a-c* in order to change the signal propagation velocity along each of the transmission lines 130*a-c*. If the adjusted propagation delay on transmission line 130*a* does not correspond to the required frequency a further adjustment is made in order to bring the oscillation frequency of this transmission line 130*a* to the required value. The time delay measurement is made on one transmission line 130*a* from the array of transmission lines 130*a-c*, but the control circuits 150*a-c* apply the adjustment to all transmission lines 130*a-c* in the array, so that each transmission line 130*a-c* produces a microwave signal of the required frequency.

Following adjustment of the frequency of each transmission line 130*a-c*, the relative timings of the pulses 70 in each transmission line 130*a-c* are measured using edge sensors at well-defined positions at the output of each transmission line 130*a-c*. The phase controller 160 has been provided with a desired phase profile for the transmission lines 130*a-c*, which has been selected to provide a desired microwave output, i.e. a microwave output having a particular transverse phase profile; the phase controller 160 compares the relative signal timing measurements to the timings that are required to form the desired phase profile. Any adjustments that are required are made by adjusting the control circuits 150*a-c* to change the velocity of the pulse 70 in the relevant transmission line circuit 130*a-c*.

Whilst the present invention has been described and illustrated with reference to particular embodiments, it will be appreciated by those of ordinary skill in the art that the invention lends itself to many different variations not specifically illustrated herein.

For example, although, in the example embodiment described above, the RF frequency of the RF pulses generated in the array is set prior to controlling their relative phases, in other example alternative embodiments the relative phases are set prior to the RF frequency, and in still other example alternative embodiments the RF frequency is less significant, and only the relative phases are actively controlled in the manner described above.

In the example embodiment described above, the time-delay measurement is made on one transmission line, but the control circuits apply the adjustment to all transmission lines in the array, so that each transmission line produces a microwave signal of the required frequency. In another alternative example embodiment, the adjustment for frequency is applied only to the transmission line on which the time delay is measured. The relative phases of all of the transmission lines are then measured, and the transmission lines are adjusted to bring the phases into the desired relationship. The adjustment of the phases also results in the frequencies of the other transmission lines being adjusted to match that of the transmission line on which the time delay is measured.

In the example embodiment described above, the frequency of the RF signals is measured by measuring the time it takes a video pulse to travel from the input sensor 155 at the start of the transmission line 130*a* to the output sensor 165*a* at the end of the transmission line 130*a*. The skilled person will understand that, in example alternative embodiments, the measurement may be made by measuring the time it takes a video pulse to travel from a start sensor to a stop sensor, the start sensor being upstream of the stop sensor in the transmission line. In other words, the measurement need not be between sensors at the input and output of the transmission line but may be between sensors at any two separate locations on the line, e.g. two locations that are both near to the end of the transmission line but one location being closer to the end than the other.

In still other example alternative embodiments, the frequency of the RF signals is measured by measuring the time between a signal from the video pulse generator being received and a video pulse being detected at a sensor on a transmission line.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may be absent in other embodiments.

The invention claimed is:

1. A phased-array RF pulse generator, comprising:
   at least one video-pulse generator configured to generate video pulses each having a leading edge;
   an array of nonlinear and dispersive transmission lines, configured to generate RF pulses from the video pulses;
   at least one sensor configured to detect the leading edges of the video pulses after they have passed along the transmission lines; and
   a phase controller configured to set a velocity of the video pulses in each transmission line to put the detected leading edges, and hence the generated RF pulses, into a desired phase relationship.

2. A phased-array RF pulse generator as claimed in claim 1, in which the transmission line comprises:
   a plurality of inductive elements and capacitative elements forming a LC ladder.

3. A phased-array RF pulse generator as claimed in claim 2, in which the inductive elements comprise: a saturable magnetic material, which causes the nonlinearity of the transmission line.

4. A phased-array RF pulse generator as claimed in claim 2 in which the capacitative elements comprise:
   at least one nonlinear capacitor, which causes the nonlinearity of the transmission line.

5. A phased-array RF pulse generator as claimed in claim 1, in which the transmission line comprises: a plurality of further capacitative elements connected to the LC ladder to cause dispersion.

6. A phased-array RF pulse generator as claimed in claim 1, in which the transmission line is configured to provide nonlinearity and dispersion as a result of an impulse-excited gyromagnetic action.

7. A phased-array RF pulse generator as claimed in claim 1, in which each transmission line is associated with a velocity controller configured to control the velocity of the video pulses as they pass along the transmission line.

8. A phased-array RF pulse generator as claimed in claim 1, in which the at least one sensor that is configured to detect the leading edge is connected to a time-to-digital converter.

9. A phased-array RF pulse generator as claimed in claim 1, in which the generated RF pulses are microwave pulses.

10. A phased-array RF pulse generator as claimed in claim 1, in which the generated RF pulses have a duration of more than 3 RF cycles and less than 150 RF cycles.

11. A phased-array radar comprising:
    a phased-array RF pulse generator according to claim 1.

12. A directed-energy weapon comprising:
    a phased-array RF pulse generator according to claim 1.

13. A phased-array RF pulse generator, comprising:
    at least one video-pulse generator configured to generate video pulses each having a leading edge;
    an array of nonlinear and dispersive transmission lines, configured to generate RF pulses from the video pulses;
    at least one sensor configured to detect the leading edges of the video pulses after they have passed along the transmission lines;
    a phase controller configured to set a velocity of the video pulses in each transmission line to put the detected leading edges, and hence the generated RF pulses, into a desired phase relationship; and
    a further sensor arranged to detect the leading edges of the video pulses at an earlier point in their propagation than the detection used in the setting of the phase of the RF pulses.

14. A phased-array RF pulse generator as claimed in claim 13, comprising:
    a frequency controller configured to calculate time of flight of the video pulses from the detections of the leading edges by the at least one sensor and the further sensor and to adjust the velocities of the video pulses so that RF pulses of a desired RF frequency are generated in the transmission lines.

15. A phased-array RF pulse generator as claimed in claim 14, in which the frequency controller is configured to adjust velocities of the video pulses in accordance with transmission-line dispersion characteristics stored in a look-up table.

16. A method of generating RF pulses, comprising:
    generating video pulses each having a leading edge;
    using an array of nonlinear and dispersive transmission lines to generate RF pulses from the video pulses;
    detecting the leading edges of the video pulses after they have passed along the transmission lines; and
    controlling a velocity of the video pulses in each transmission line to put the detected leading edges, and hence the generated RF pulses, into a desired phase relationship.

* * * * *